United States Patent
Rodriguez

(10) Patent No.: US 10,412,861 B2
(45) Date of Patent: Sep. 10, 2019

(54) EQUIPMENT ENCLOSURE AIR FLOW CONTROL SYSTEM

(71) Applicant: International Business Machines Corporation, Armonk, NY (US)

(72) Inventor: Jean-Michel Rodriguez, Mauguio (FR)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 14/884,902

(22) Filed: Oct. 16, 2015

(65) Prior Publication Data

US 2016/0135334 A1    May 12, 2016

(30) Foreign Application Priority Data

Nov. 11, 2014   (GB) .................................. 1420060.4

(51) Int. Cl.
    *F28F 13/08*     (2006.01)
    *H05K 7/20*      (2006.01)

(52) U.S. Cl.
    CPC ..... *H05K 7/20836* (2013.01); *H05K 7/20736* (2013.01); *H05K 7/20745* (2013.01)

(58) Field of Classification Search
    CPC .................. H05K 7/20736; H05K 7/20836
    USPC .................... 454/184; 361/695, 690, 694
    See application file for complete search history.

(56) References Cited

U.S. PATENT DOCUMENTS

| 1,939,312 A * | 12/1933 | Murray ................... E06B 7/082 454/195 |
| 6,776,707 B2 * | 8/2004 | Koplin ..................... G06F 1/18 361/694 |
| 7,630,795 B2 | 12/2009 | Campbell et al. |
| 8,783,336 B2 | 7/2014 | Slessman |

(Continued)

FOREIGN PATENT DOCUMENTS

| CN | 201986334 U | 9/2011 |
| CN | 103140116 A | 6/2013 |

(Continued)

OTHER PUBLICATIONS

Nakamichi, "Electronic device provided with filter unit", Jan. 17, 2012.*

(Continued)

*Primary Examiner* — Vivek K Shirsat
*Assistant Examiner* — Ryan L Faulkner
(74) *Attorney, Agent, or Firm* — Jared C. Chaney

(57) ABSTRACT

Disclosed is a system and method for control of air flow in an enclosure. A system discloses: a first element located on a first surface of the equipment enclosure having: first and second reels located along opposing edges of the first element; and a first air flow control element located between first and second reels and having a first portion and a second portion, said first portion being located on an edge of the first element adjoining the first reel, said second portion being located on an edge of the first element adjoining the second reel, each having apertures located therein of a number or cross sectional area different from the other portions, move- (Continued)

ment of the first air flow control element from a first reel to a second reel by rotation of the reels causing the first portion or second portion to be positioned between the first and second reels.

4 Claims, 7 Drawing Sheets

(56) References Cited

U.S. PATENT DOCUMENTS

| | | | |
|---|---|---|---|
| 2012/0134110 A1* | 5/2012 | Chang | H05K 7/20736 |
| | | | 361/695 |
| 2013/0133873 A1 | 5/2013 | Campbell et al. | |
| 2013/0180271 A1 | 7/2013 | Kuczynski et al. | |
| 2013/0264027 A1 | 10/2013 | Eckberg et al. | |
| 2014/0090806 A1 | 4/2014 | Coico et al. | |

FOREIGN PATENT DOCUMENTS

| | | | | |
|---|---|---|---|---|
| DE | 19844678 A1 | | 4/2000 | |
| GB | 2510750 A | | 8/2014 | |
| JP | WO2012099095 | * | 7/2012 | ......... B01D 46/0046 |
| JP | 2012151298 A | | 8/2012 | |
| KR | 20010054926 | * | 7/2001 | ............... B60H 1/00 |
| WO | 2012099095 A1 | | 7/2012 | |
| WO | WO2014073978 | * | 5/2014 | ............ F24F 13/082 |

OTHER PUBLICATIONS

Oh Man Ju, "Air conditioning for automobile", Jul. 2, 2001.*
GB Intellectual Property Office, Examination Report under Section 18(3) for GB Application GB1420060.4, dated Jul. 12, 2016, 2 pages.
GB Intellectual Property Office, Intention to Grant under Section 18(4) for GB Application GB1420060.4, dated Oct. 4, 2016, 2 pages.
Rodriguez, J., "Equipment Enclosure Air Flow Control System," U.S. Appl. No. 15/422,189, filed Feb. 1, 2017.
List of IBM Patents or Patent Applications Treated as Related, Signed Feb. 1, 2017, 2 pages.
NER Data Corporation, "Dynamic Airflow Management," Retrieved Aug. 12, 2015, 4 pages, retrieved from: http://web.archive.org/web/20140911020028/http://www.nerdata.com/cooling_Dynamic_Airflow_Management.htm.
GB Intellectual Property Office, Search Report under Section 17(5) for Application GB1420060.4 dated May 6, 2015, 3 pages.
Oxford English Dictionary, Door Definition.pdf, Printed Dec. 7, 2017, 5 Pages.

* cited by examiner

EQUIPMENT ENCLOSURE AIR FLOW CONTROL SYSTEM

FIELD OF THE INVENTION

The present invention relates to the control of air flow in an equipment enclosure, and more particularly, to the control of air flow in an equipment enclosure through the use of a moveable air flow control element having a plurality of portions, each portions having apertures of a number or cross sectional area different from the apertures of other portions.

BACKGROUND

Different Information Technology (IT) resources in equipment enclosures require different air flow and air pressure for cooling of the resources. Conventionally, each of the equipment enclosures hosted by a data center needs to have a specific door physically designed and adapted to the content of equipment in the equipment enclosure and its corresponding different air flow and air pressure requirements. Typically, the equipment is mounted in a rack enclosure having a front door for access to equipment in the rack enclosure and, optionally, a back door, also allowing access to the equipment in the rack enclosure.

The need to have a different design of door for each of the enclosures means that the type of equipment that may be hosted in the rack enclosure is constrained to such equipment as is compatible with the air flow and air pressure provided by the door used in conjunction with the rack enclosure. This can lead to wasted space in the rack enclosure, poor optimization of the cooling, wasted energy and IT resource risks.

Chinese Utility Model CN 201986334 U discloses an adaptive dynamic precision air supply control apparatus in which air flow through a duct is controlled by the degree of opening of a damper (which is hereby incorporated by reference).

GB Patent Application 2,510,750 A discloses a data center having a building door with a controllable air intake, such as a vent or a plurality of blades moved by motors (which is hereby incorporated by reference).

BRIEF SUMMARY OF THE INVENTION

Embodiments of the invention provide a system for control of air flow in an equipment enclosure, the system comprising: a first element located on a first surface of the equipment enclosure, the first element having: first and second reels located along opposing first and second edges of the first element; and a first air flow control element located between said first and second reels and having at least a first portion and a second portion, said first portion being located on an edge of the first air flow control element adjoining the first reel, said second portion being located on an edge of the first air flow control element adjoining the second reel, each of the first and second portions having apertures located therein of a number or cross sectional area different from the other of said first and second portions, movement of the first air flow control element from a first reel to a second reel by rotation of the first and second reels causing the first portion to be positioned substantially between the first and second reels or the second portion to be positioned substantially between the first and second reels. Embodiments of the invention provide the advantage of allowing a single element to be used on many different equipment enclosures having differing requirements for air flow, temperature, humidity and pressure.

In an embodiment, the system further comprises an air flow control module, responsive to input from air flow probes and/or air analyzing probes and causing rotation of the reels such that the first portion is positioned substantially between the first and second reels or the second portion is positioned substantially between the first and second reels, so as to achieve a desired air flow. This has the advantage of an automated control of the air flow, temperature, humidity and pressure.

In embodiments, said air flow probes and/or air analyzing probes measure one or more of the air flow, air temperature, air humidity or air pressure.

In an embodiment, the system further comprises a manual control for selection of the first portion or the second portion of the first air flow control element and causing rotation of the reels to cause the first portion to be positioned substantially between the first and second reels or the second portion to be positioned substantially between the first and second reels. This has the advantage of offering manual control of the air flow, temperature, humidity and pressure.

In an embodiment, the system further comprises: a second element located on a second surface of the equipment enclosure, opposing the first surface of the equipment enclosure, the second element having: third and fourth reels located along opposing first and second edges of the second element; and a second air flow control element located between said third and fourth reels and having at least a first portion and a second portion, said first portion being located on an edge of the second air flow control element adjoining the third reel, said second portion being located on an edge of the second air flow control element adjoining the fourth reel, each of the first and second portions having apertures located therein of a number or cross sectional area different from the other of said first and second portions, movement of the second air flow control element from a third reel to a fourth reel by rotation of the third and fourth reels causing the first portion to be positioned substantially between the third and fourth reels or the second portion to be positioned substantially between the third and fourth reels. This has the advantage of providing two elements for controlling air flow, temperature, humidity or pressure on a single enclosure, perhaps located on a front door and a back door of an enclosure.

In an embodiment, at least one portion of an air filter control element has no apertures located therein. This has the advantage of allowing embodiments of the equipment enclosures to be used in a data center where the cooling air comes from beneath the equipment enclosure through the floor of a data center.

In another embodiment, the first air flow control element further comprises a third portion and a fourth portion, said third and fourth portions being located on the first air flow control element between said first and second portions, each of the third and fourth portions having apertures located therein of a number or cross sectional area different from the others of said first, second, third and fourth portions, movement of the first air flow control element from a first reel to a second reel by rotation of the first and second reels causing one of the first, second, third or fourth portions to be positioned substantially between the first and second reels. The use of four separate portions of the air flow control element allows for finer control of the air flow, temperature, humidity or pressure.

Embodiments of the invention also provide a method of control of air flow in an equipment enclosure, the method comprising the steps of: measuring the air flow through a first element located on a first surface of the equipment enclosure; comparing the measured air flow with a desired air flow; and rotating first and second reels located along opposing first and second edges of the first element so as to cause a first portion of an air flow control element to be positioned substantially between the first and second reels or a second portion of an air flow control element to be positioned substantially between the first and second reels, said first portion of the air flow control element being located on an edge of the first air flow control element adjoining the first reel, said second portion being located on an edge of the first air flow control element adjoining the second reel, each of the first and second portions having apertures located therein of a number or cross sectional area different from the other of said first and second portions, movement of the first air flow control element from a first reel to a second reel by rotation of the first and second reels causing the first portion to be positioned substantially between the first and second reels or the second portion to be positioned substantially between the first and second reels.

Embodiments of the invention also provide a rack for holding information technology equipment, the rack comprising: a rack enclosure; a door attached to the rack enclosure; and an air flow control system having: a first reel positioned at a first edge of the door, and a second reel positioned at a second edge of the door, a plurality of contiguously arranged airflow control elements spooled between the first reel and second reel, each airflow control element having different aperture arrangements for allowing airflow there through, and an airflow control module that rotates the first and second reels to position a selected airflow control element therebetween.

BRIEF DESCRIPTION OF THE DRAWINGS

Preferred embodiments of the present invention will now be described in more detail, by way of example only, with reference to the accompanying drawings, in which.

DETAILED DESCRIPTION OF THE EMBODIMENTS

Figure 1:
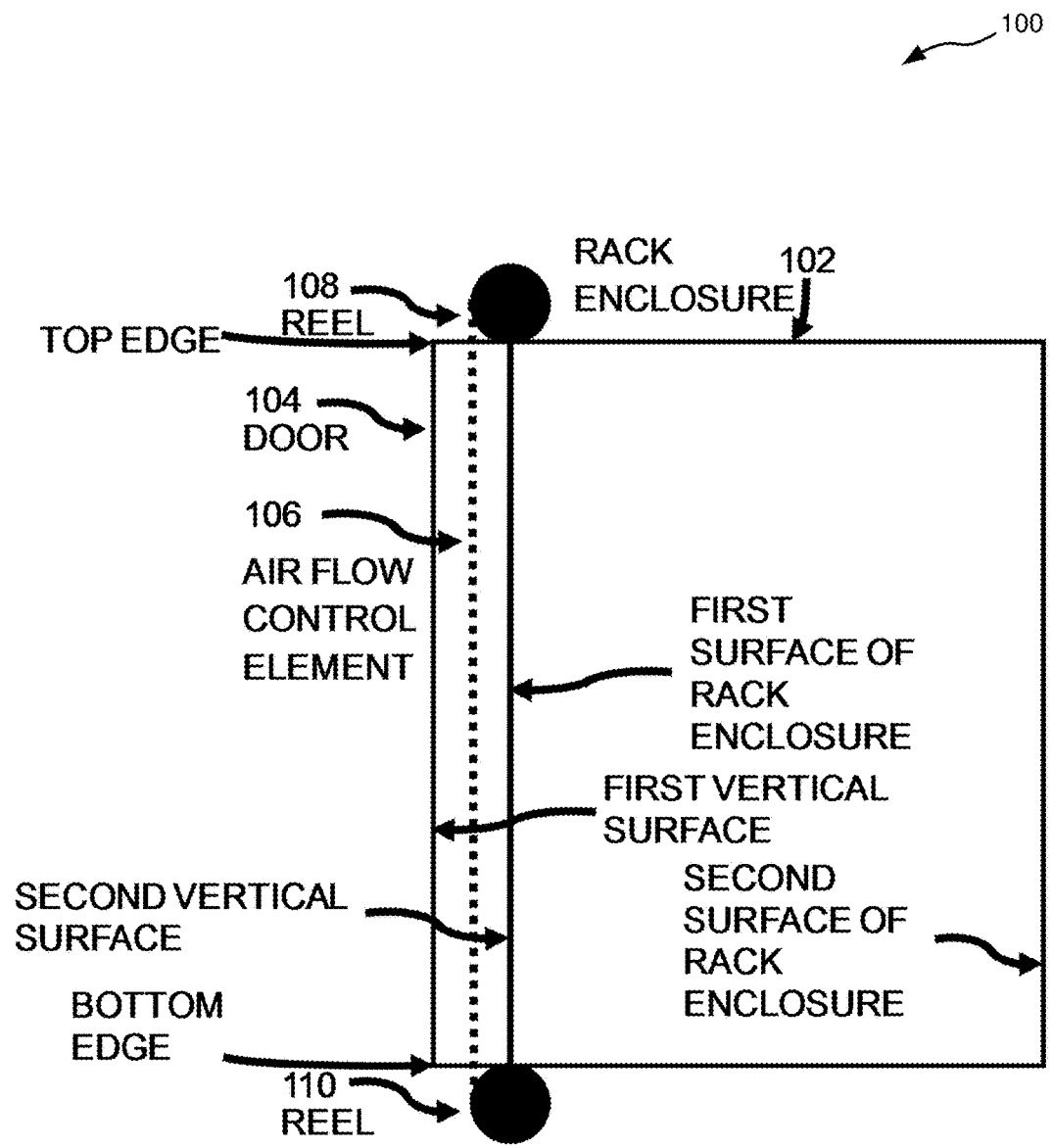
FIG. 1 shows an air flow control system according to a first embodiment of the present invention positioned on a rack enclosure.

FIG. 1 shows an air flow control system according to a first embodiment of the present invention positioned on a rack enclosure 102. The air flow control system has a first reel 108 and a second reel 110 located along opposing first and second edges of the rack enclosure door 104. Between the first reel 108 and the second reel 110 is a first air flow control element 106. The first air filter control element 106 has a length sufficient to allow movement of the first air flow control element 106 from reel 108 to reel 110 to allow at least two different portions (202, 204, 206, 208 of FIG. 2) to be able to be positioned across the rack enclosure door 104. First reel 108 and second reel 110 are located, respectively, along a top edge and a bottom edge of first door 104, with first air flow control element 106 (i) being located between first reel 108 and second reel 110, (ii) being located between a first vertical surface of first door 104 and a second vertical surface of first door 104 such that first air flow control element 106 does not touch the first vertical surface of first door 104 and such that first air flow control element 106 does not touch the second vertical surface of first door 104, and (iii) having at least a first portion and a second portion.

In an embodiment, the first air flow control element 106 has a length of at least twice the distance between the reels 108, 110 and in embodiments may be, for example, four times the distance between the reels 108, 110. The air flow control element 106 is divided into portions (202, 204, 206, 208 in FIG. 2) of approximately the distance between the reels 108, 110. The air flow control element 106 is able to be moved from a first position where it is rolled around reel 108 with one end attached to reel 110 to a second position where it is attached to reel 108 and rolled around reel 110. In another embodiment, the portions (202, 204, 206, 208 in FIG. 2) may extend for less than the distance between the reels such that parts of both a first portion and a second portion extend across the rack enclosure door 104.

In an embodiment, the reels 108, 110 are located along the top edge and the bottom edge of the enclosure door 104, but in other embodiments they may be located along the two sides of the enclosure door 104. Locating the reels 108, 110 along the top edge and the bottom edge of the enclosure door 104 means that the air flow control element 106 is less likely to sag between the reels 108, 110.

In an embodiment in which the air flow control element has a length of twice the distance between the reels 108, 110, in the first position, a first portion 202 of the air flow control element 106 is rolled around the reel 108 and a second portion 204 extends across the door to the other reel 110 to which it is attached. In the second position, the second portion 204 of the air flow control element 106 is rolled around reel 110 and the first portion 202 extends across the door to the other reel 108 to which it is attached. Movement from the first position to the second position is achieved by rotation of the reels 108, 110. In each of the first and second positions, a different air flow results from the different apertures in the air flow control element extending across the rack enclosure door 104.

In an embodiment in which the air flow control element has a length of four times the distance between the reels 108, 110, the first portion 202 is attached to reel 108 and the fourth portion 208 is attached to reel 110. In the first position, first, second and third portions 202, 204, 206 of the air flow control element 106 are rolled around the reel 108 and fourth portion 208 extends across the door to the other reel 110. In a second position, the first and second portions 202, 204 of the air flow control element 106 are rolled around reel 108, the third portion 206 extends across the door to the other reel 110 and the fourth portion 208 is rolled around reel 110. In a third position, the first portion 202 of the air flow control element 106 is rolled around reel 108, the second portion 204 extends across the door to the other reel 110 and the third and fourth portions 206, 208 are rolled around reel 110. In a fourth position, the first portion 202 of the air flow control element 106 is attached to reel 108 and extends across the door to the other reel 110. The second, third and fourth portions 202, 204, 206 are rolled around reel 110. Movement from the first position to the second, third or fourth positions is achieved by rotation of the reels 108, 110. In each of the first, second, third and fourth positions, a different air flow results from the different apertures being used in the air flow control element.

Figure 2:
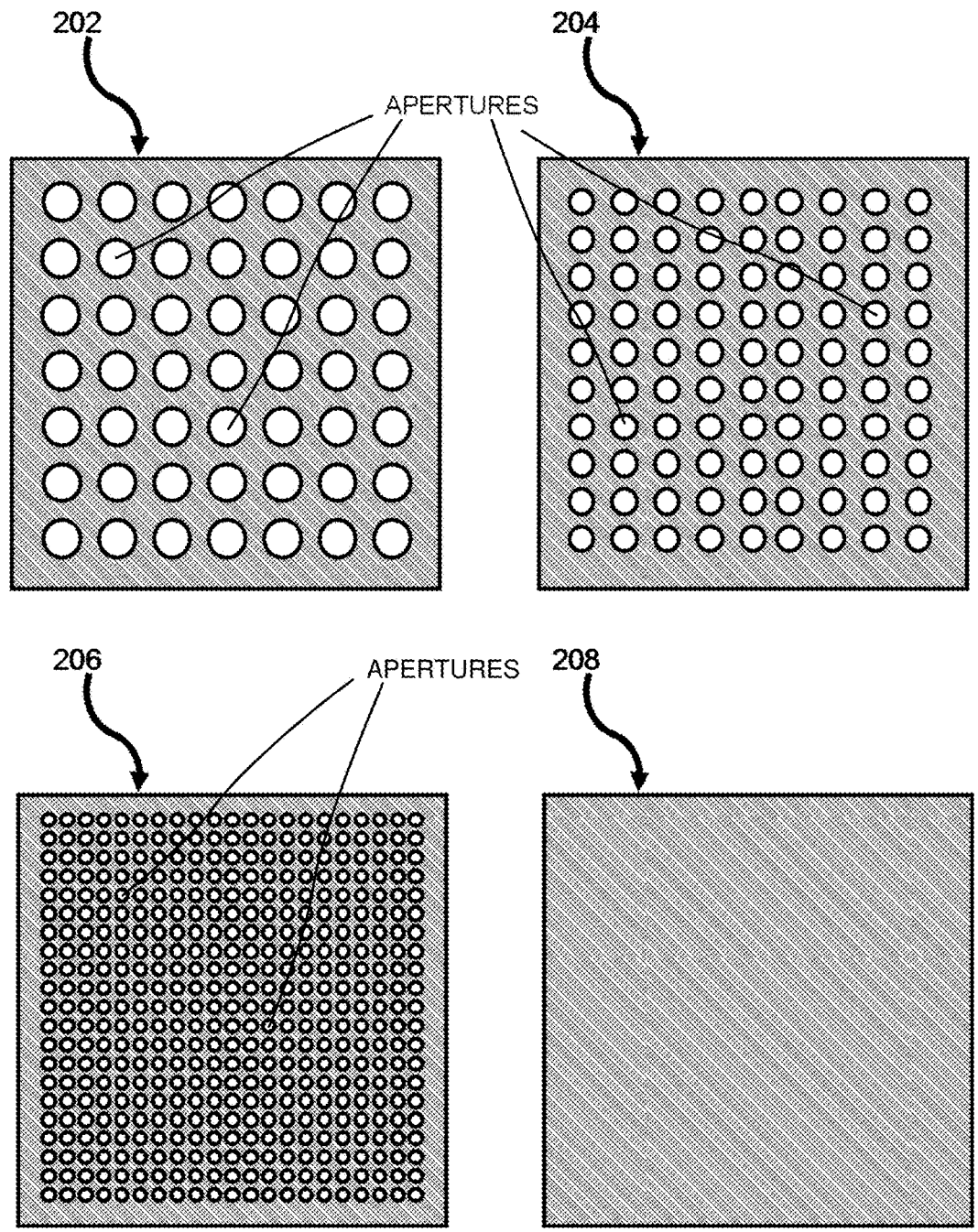
FIG. 2 shows portions of the air flow control element of FIG. 1.

Referring to FIG. 2, each portion 202, 204, 206, 208 of the air flow control element 106 has apertures located therein of a number or cross sectional area different from the other portions 202, 204, 206, 208 of the air flow control element 106. The shape, number and cross sectional area of the apertures shown in FIG. 2 is merely representative. The apertures may be any shape, such as a circle, a square, a rectangular slot or any other shape. They may be distributed evenly over the portion of the airflow control element 106 or they may be distributed unevenly. The apertures in portion 202 cover a large proportion of the area and so allow a substantial volume of air to flow through the air flow control element 106. The apertures in portion 206 cover a small proportion of the area and so allow only a small volume of air to flow through the air flow control element 106. The apertures in portion 204 are intermediate in cross sectional area between those of portion 202 and portion 206 and so allow a volume of air intermediate between that of portion 202 and portion 206 to flow through the air flow control element 106.

Optionally, one of the portions 208 of the air flow control element 106 may have no apertures in it meaning that there is no air flow through the air flow control element. Such a configuration may be used when the rack enclosure 102 is used in a data center where the cooling air comes from beneath the rack enclosure through the floor of the data center.

Figure 3:
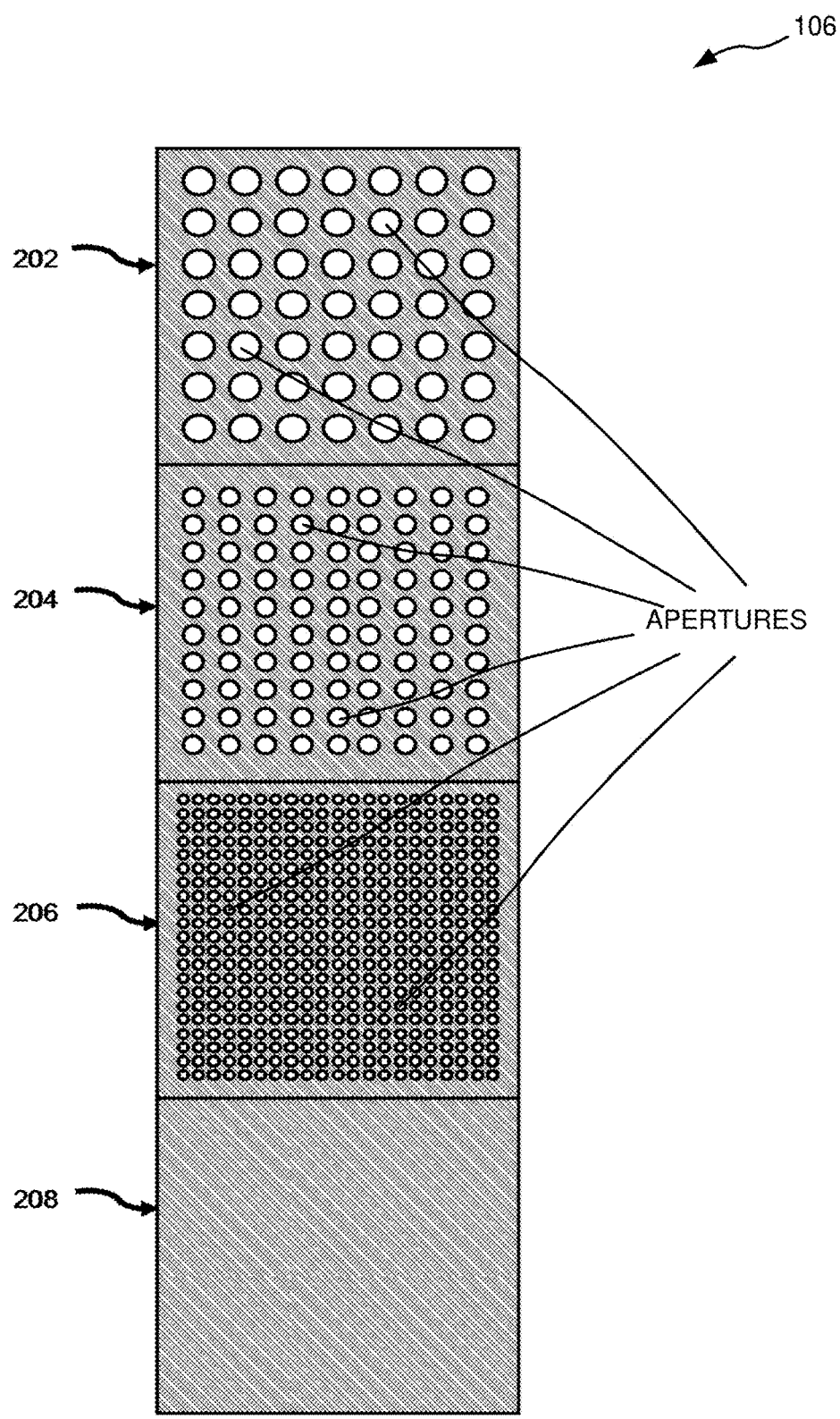
FIG. 3 shows the entirety of the air flow control element of FIG. 2.

Referring to FIG. 3, the air flow control element 106 of FIG. 1 is shown in its entirety. The air flow control element 106 comprises portions 202, 204, 206, 208 as described above with reference to FIG. 2. The portions 202, 204, 206, 208 are located adjacent to each other along a single length of the air flow control element 106.

Figure 4:
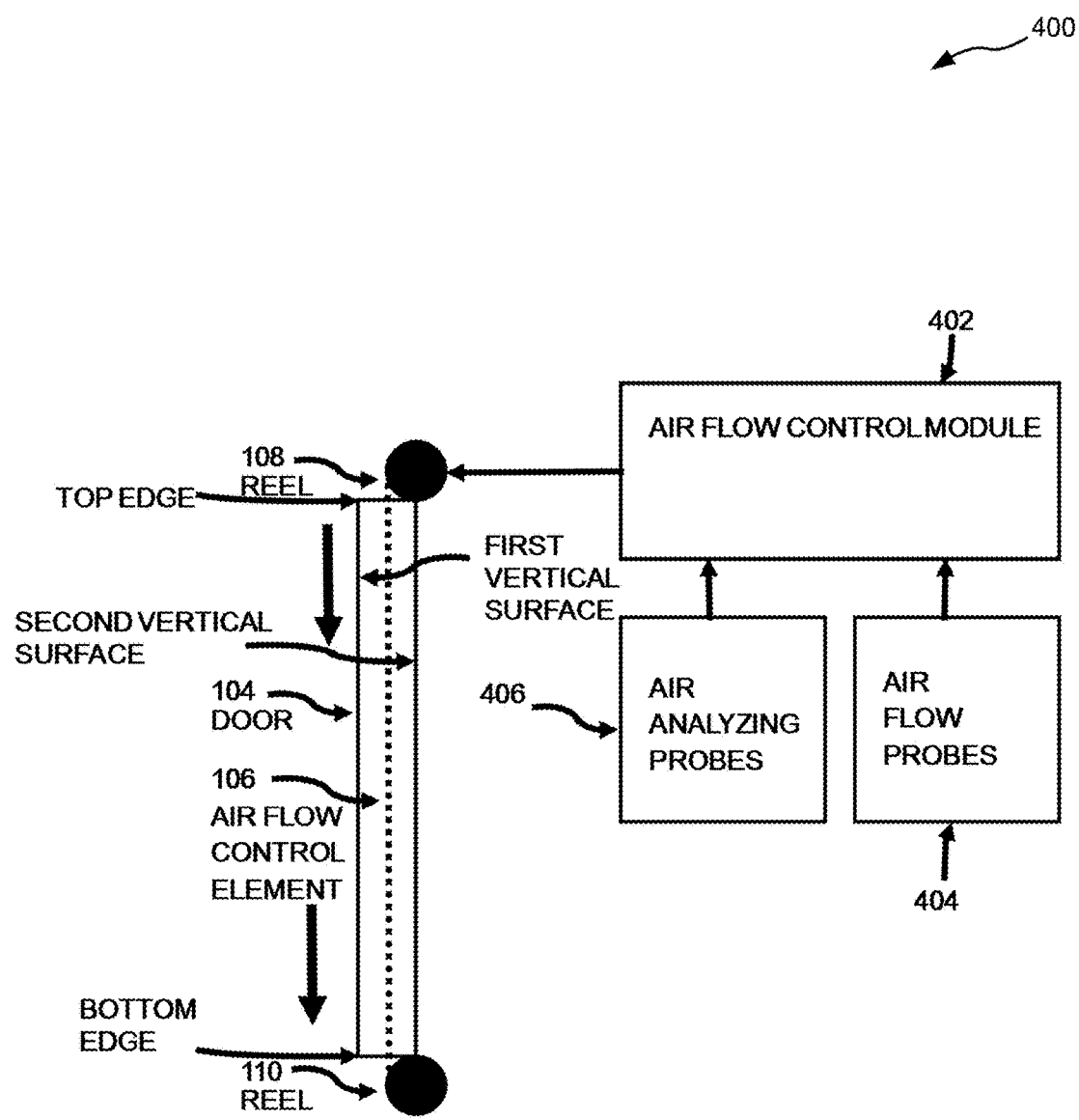
FIG. 4 shows the air flow control system of FIG. 1 and a first embodiment of air control equipment.

Referring to FIG. 4, the door 104, air flow control element 106 and reels 108, 110 correspond to those of FIG. 1. FIG. 4 also shows an air flow control module 402, air flow probes 404 and air analyzing probes 406. Air flow control module 402 controls the rotation of reels 108, 110 in order to determine which portions 202, 204, 206, 208 of the air flow control element 106 are positioned across the door 104. The control of the rotation of the reels 108, 110 typically involves both the rotation of the reels 108, 110 and the sensing of the position of the reels 108, 110 in order that the air flow control module knows which portion 202, 204, 206, 208 of the air flow control element 106 is positioned across the door 104. Such control of the rotation of the reels will be well known to persons skilled in the art. The use of air flow probes 404 or air analyzing probes 406 is particularly advantageous in data centers having some parts of the data center where an air flow will differ from other parts of the data center.

The air flow control module 402 may receive input from either or both of air flow probes 404 or air analyzing probes 406. Air flow probes 404 determine the volume of air or the flow rate of air passing through the selected portion 202, 204, 206, 206 of the air flow control element 106 into the rack enclosure 102 or out of the rack enclosure 102. A single air flow probe 404 may be used or multiple probes 404 may be used to determine the air flow at multiple points in the rack enclosure 102.

Air analyzing probes 406 may be used to analyze the air flowing into or out of the rack enclosure 102. The analysis may be measurement of parameters associated with the air such as temperature, humidity or pressure. As an example, if the air temperature is too high, then it may be desired to have a greater flow of air. This can be achieved by rotating reels 108, 110 so that a portion 202 of the air flow control element having larger apertures is positioned across the door 102. Similarly, if the humidity of the air is too high, then it may be desired to have a greater flow of air. This can also be achieved by rotating reels 108, 110 so that a portion 202 of the air flow control element having larger apertures is positioned across the door 102. Similarly, if the pressure of the air is too high, then it may be desired to have a greater flow of air. This can also be achieved by rotating reels 108, 110 so that a portion 202 of the air flow control element having larger apertures is positioned across the door 102. A single air analyzing probe 406 may be used or multiple probes 406 may be used to determine the parameters associated with the air at multiple points in the rack enclosure 102.

Figure 5:
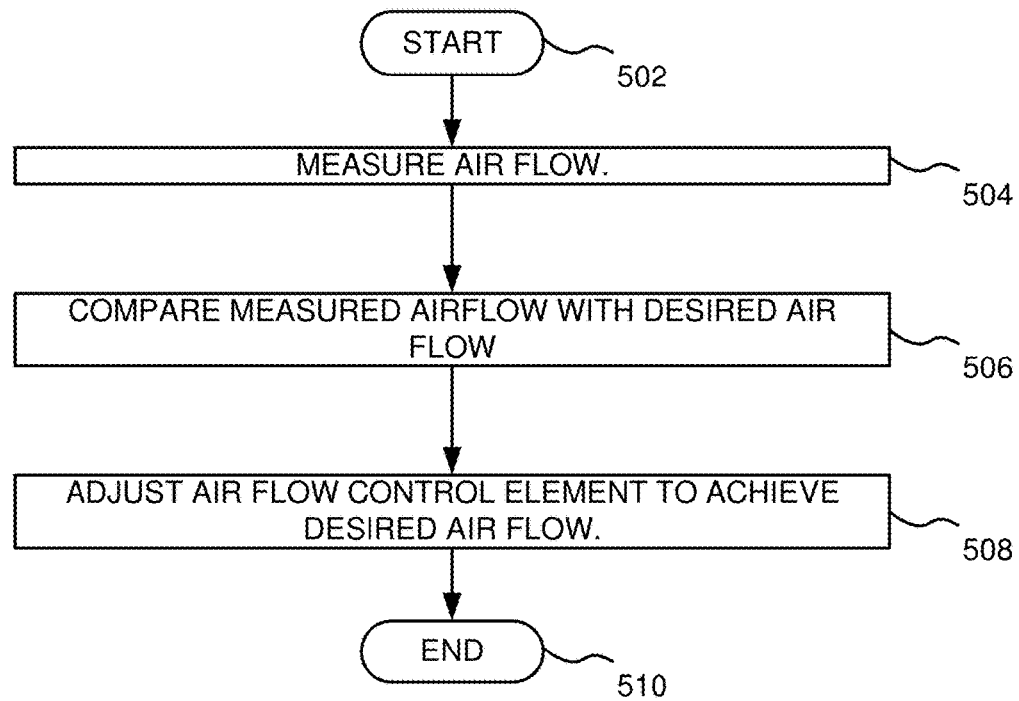
FIG. 5 shows a method of air flow control according to an embodiment of the present invention.

Referring to FIG. 5, an embodiment of a method of air flow control according to the present invention is shown. The method begins at step 502. At step 504, the air flow is measured by probes 404 or by any other method of measurement of air flow. As described above, in embodiments of the invention, other parameters of the air may be measured, such as its temperature, humidity or pressure. At step 506, the air flow measured at step 504 is compared with a desired air flow. This may be done by the air flow control module 402. At step 508, the air flow control element 106 is adjusted in order to achieve the desired air flow. This adjustment may be done by the air flow control module 402 rotating reels 108, 110 until a selected portion 202, 204, 206, 208 of the air flow control element is positioned across the door 104. Air flow will typically be increased by the use of a portion 202 having larger apertures and reduced by the use of a portion 208 having smaller or no apertures. The method ends at step 510.

Figure 6:
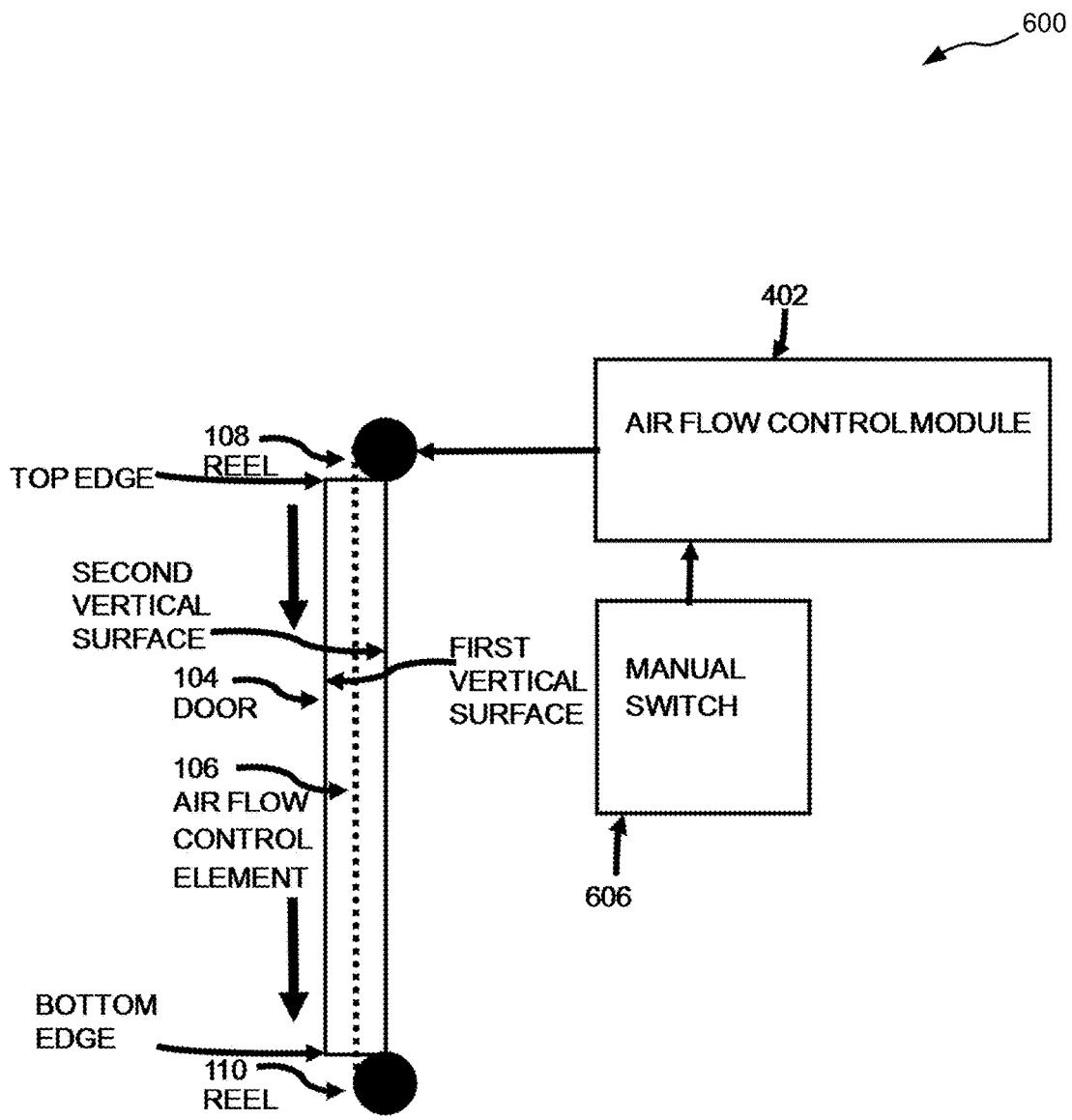
FIG. 6 shows the air flow control system of FIG. 1 and a second embodiment of air flow control equipment.

FIG. 6 shows the enclosure door 104 of FIG. 1 and a second embodiment 600 of air flow control equipment. In the second embodiment, the air flow probe 404 or the air analyzing probe 406 is replaced by a simple manual switch 606. This may take the form of a physical switch 606 having a plurality of positions, typically with each of the positions corresponding to a different one of the portions 202, 204, 206, 208 being positioned across the door 104 of the rack enclosure 102. The physical switch 606 may be a rotary switch having different positions or it may be push buttons to increase or to decrease the air flow, optionally accompanied by a display showing the current position. It may also take the form of a switch implemented in a computer system, such that selection of the appropriate choice results in a different one of the portions 202, 204, 206, 208 of the air filter control element 106 being positioned across the door 104 of the rack enclosure 102. In an embodiment, both a physical switch 606 and a switch in a computer system may be implemented. In the embodiment of FIG. 6, there is no direct control of which portion 202, 204, 206, 208 of the air filter control element 106 is positioned across the enclosure door 104 by the air flow control module 402 and its associated air flow probes 404 or air analyzing probes 406.

Figure 7:
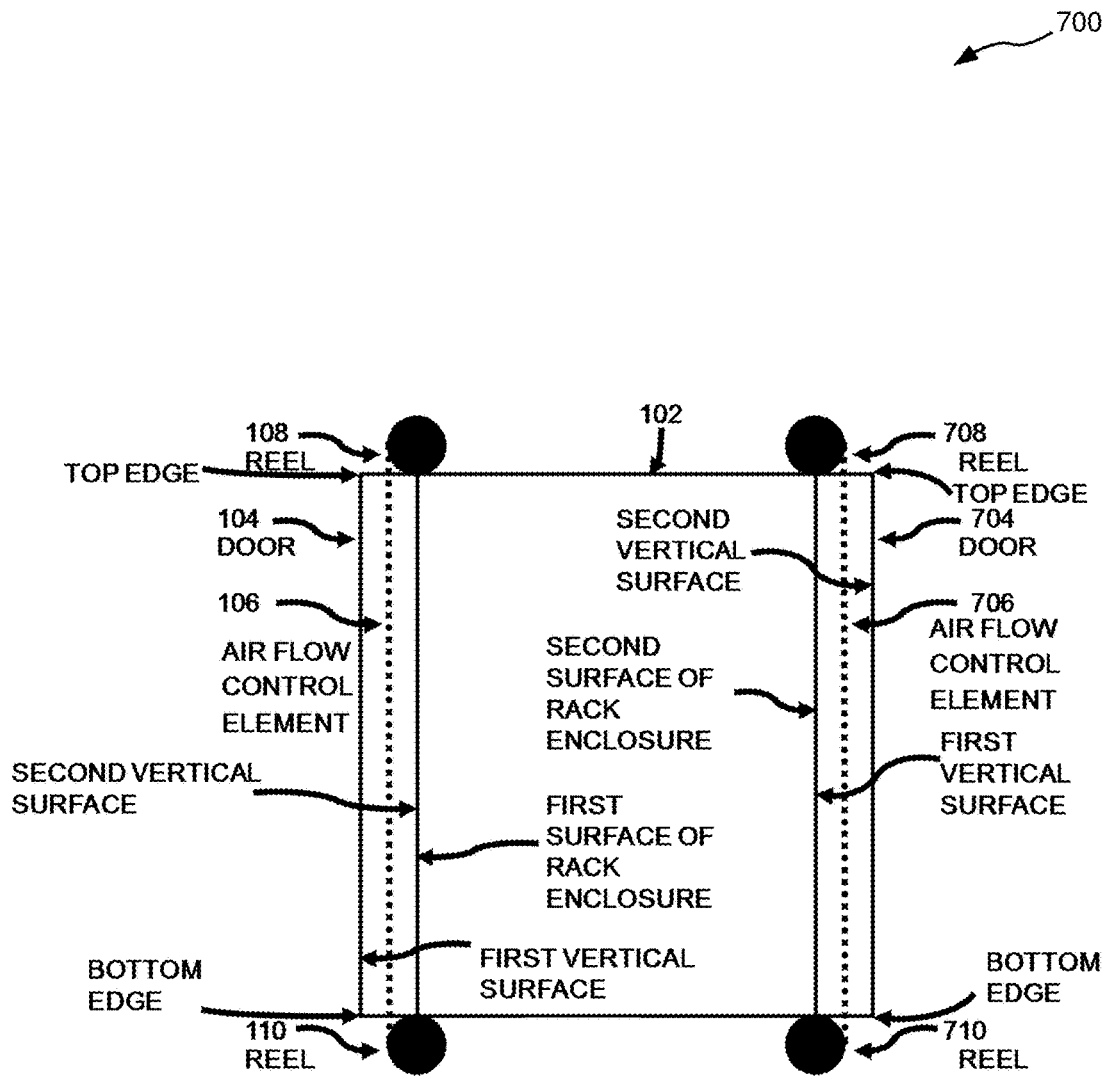
FIG. 7 shows an air flow control system according to a second embodiment of the present invention positioned on a rack enclosure.

FIG. 7 shows an enclosure door 104 according to a second embodiment 700 of the present invention positioned on a rack enclosure 102. In the second embodiment, two surfaces of the rack enclosure 102 have reels 108, 110, 708, 710 and air flow elements 106, 706 located thereon. Each of the air flow control elements 106, 706 may be operated by a separate air flow control module 402 or they may both be operated by a common air flow control module 402. Air flow probes 404 and air analyzing probes 406 may be positioned at points in the rack enclosure 102 to determine the air flow, temperature, humidity, pressure or other characteristics of the air. Air flow control elements 106, 706 may be operated such that the same cross sectional area of aperture is positioned across the door 104 and the door 704 or they may be operated such that different cross sectional areas of aperture are positioned across the door 104 and door 704.

Third reel 708 and fourth reel 710 are located, respectively, along a top edge and a bottom edge of second door 704, with second air flow control element 706 (i) being located between third reel 708 and fourth reel 710, (ii) being located between a first vertical surface of second door 704 and a second vertical surface of second door 704, such that second air flow control element 706 does not touch the first vertical surface of second door 704 and such that second air flow control element 706 does not touch the second vertical surface of second door 704, and (iii) having at least a first portion and a second portion.

In a variation of the embodiments of FIGS. 1, 4, 6 and 7, the air flow control element 106 may be continuous, that is there are no separate ends. In these variations, the unused portions 202, 204, 206, 208 of the air flow control element 106 return from one reel 108 to another reel 110 by a route that does not result in the air flow being controlled. In particular, in a variation of the embodiment of FIG. 7, the air flow control element 106 and air the flow control element 706 form one continuous air flow control element, which extends from reel 108 to reel 708 and from reel 710 to reel 110. The portions from reel 108 to reel 708 and from reel 710 to reel 110 are configured such that no air flows into or out of the rack enclosure 102 through them.

Embodiments of the invention have been described with reference to air flow being controlled into and out of equipment in the rack enclosure 102, such equipment being typically information handling systems including data processing equipment and power supplies for such equipment. Other applications for embodiments of the present invention may include any other application where it is desired to provide control of air flow into an enclosed area, such as storage areas or areas occupied by persons.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, column-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A system comprising: a first air flow enclosure door attached to a first surface of a rack enclosure, the first air flow enclosure door having first and second reels located along a top edge and a bottom edge of the first air flow enclosure door, wherein the first air flow enclosure door is physically designed to accommodate an air flow requirement of the rack enclosure; and a first air flow control element partially located between a first vertical surface of the first air flow enclosure door and a second vertical surface of the first air flow enclosure door such that the first air flow control element does not touch the first vertical surface of the first air flow enclosure door and such that the first air flow control element does not touch the second vertical surface of the first air flow enclosure door, and having at least a first portion and a second portion, a second air flow enclosure door located on a second surface of the rack enclosure, opposing the first surface of the rack enclosure, the second air flow enclosure door having third and fourth reels located along a top edge and a bottom edge of the second air flow enclosure door, wherein the first air flow control element is a continuous element that extends from the first reel to the second reel which comprises indirectly extending from the first to the second by extending from the first reel to a third reel, around the third reel, from the third reel to a fourth reel, around the fourth reel, and from the fourth reel to the second reel, each of the first and second portions having apertures located therein of a cross sectional area different from the other of the first and second portions.

2. The system of claim 1 further comprising an air flow control module, responsive to input from at least one of air flow probes and air analyzing probes and causing rotation of the reels such that the first portion is positioned between the first and second reels or the second portion is positioned between the first and second reels, so as to achieve a desired air flow.

3. The system of claim 2 wherein the air flow probes measure one or more of air flow, air temperature, air humidity or air pressure.

4. The system of claim 1 further comprising a manual switch for selection of the first portion or the second portion of the first air flow control element and causing rotation of the reels to cause the first portion to be positioned between the first and second reels or the second portion to be positioned between the first and second reels.

* * * * *